United States Patent
Imamura et al.

(10) Patent No.: US 6,796,025 B2
(45) Date of Patent: Sep. 28, 2004

(54) METHOD FOR MOUNTING ELECTRONIC PART AND PASTE MATERIAL

(75) Inventors: Kazuyuki Imamura, Kawasaki (JP); Osamu Yamaguchi, Kawasaki (JP); Yasunori Fujimoto, Kawasaki (JP); Toshiya Akamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 10/084,370

(22) Filed: Feb. 28, 2002

(65) Prior Publication Data
US 2002/0185309 A1 Dec. 12, 2002

(30) Foreign Application Priority Data
May 1, 2001 (JP) ........................................ 2001-134532

(51) Int. Cl.$^7$ ................................................ H05K 3/34
(52) U.S. Cl. ........................... 29/840; 29/825; 29/832; 438/610; 438/612; 438/613
(58) Field of Search .......................... 29/825, 832, 840, 29/821; 438/610, 612, 613; 228/175, 721

(56) References Cited

U.S. PATENT DOCUMENTS 5,328,087 A * 7/1994 Nelson et al. .............. 228/175
5,445,308 A * 8/1995 Nelson et al. .............. 228/121
6,335,563 B1 * 1/2002 Hashimoto .................. 257/632
6,368,895 B1 * 4/2002 Hori ........................... 438/108
6,524,943 B1 * 2/2003 Sakuyama ................... 438/613
6,621,172 B2 * 9/2003 Nakayama et al. ......... 257/787
6,670,264 B2 * 12/2003 Sakuyama et al. .......... 438/610

FOREIGN PATENT DOCUMENTS

JP          11-186334          7/1999

* cited by examiner

*Primary Examiner*—Carl J. Arbes
(74) *Attorney, Agent, or Firm*—Westerman, Hattori, Daniels & Adrian, LLP

(57) ABSTRACT

In a method for mounting an electronic part on a mounting substrate in that projection electrodes provided on the electronic part are welded by fusion to join connection terminals provided on the mounting substrate, the flux paste includes a base flux and metal grains having diameters smaller than the diameters of projection electrodes and having a thickness so as to form a space between the flux paste and the electronic part when the electronic part is mounted on the mounting substrate and the flux paste is arranged on the mounting substrate. A resin is sealed in the space formed between the electronic part and the mounting substrate after the projection electrodes are joined to the connection terminals.

11 Claims, 6 Drawing Sheets

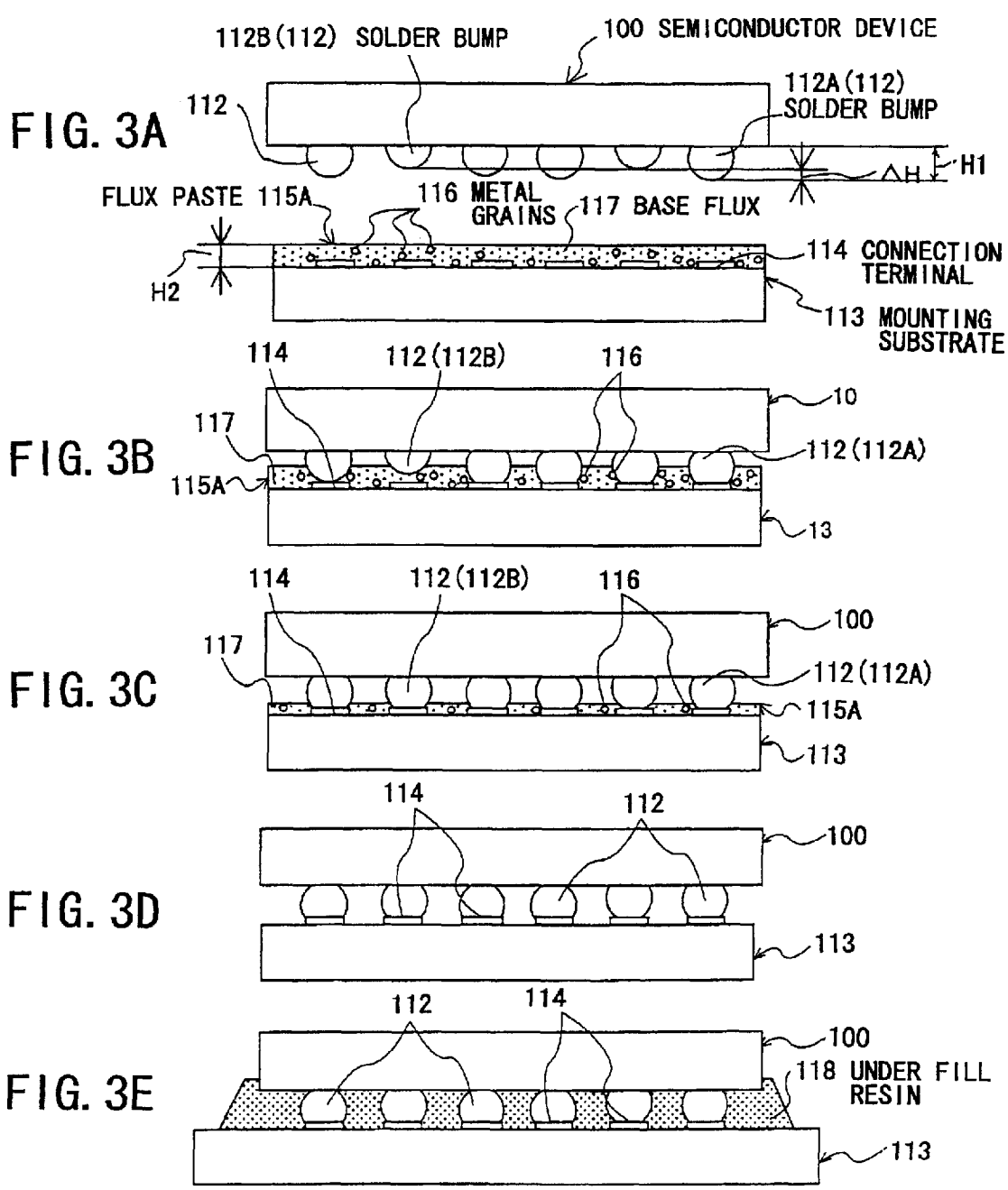

FIG. 7
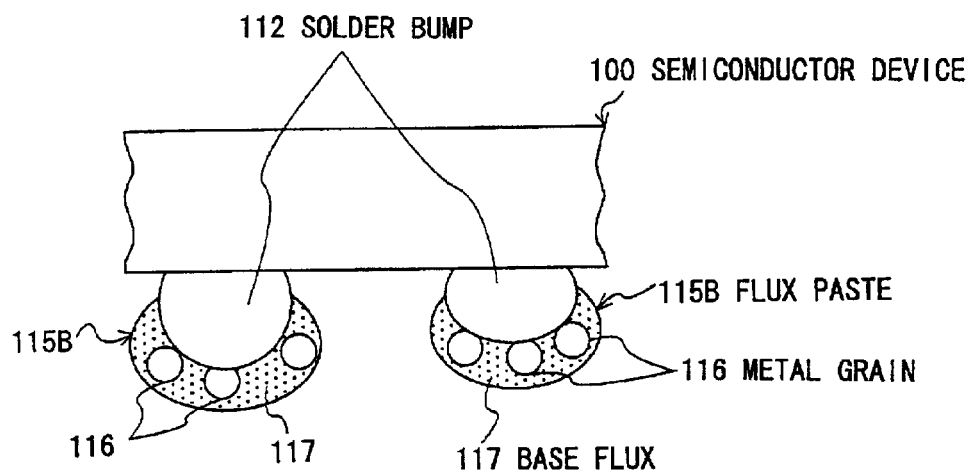
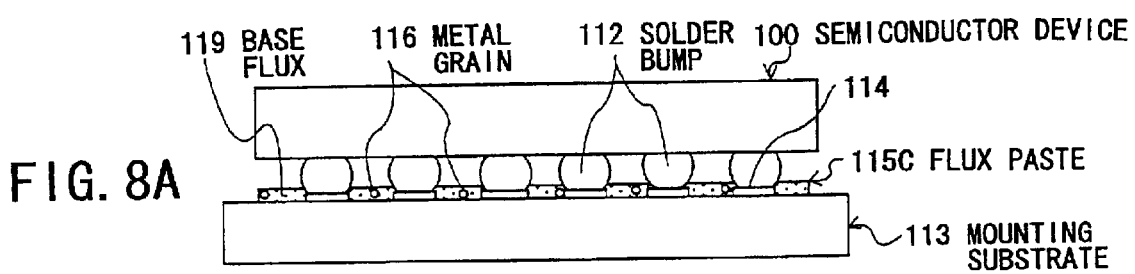
FIG. 8A
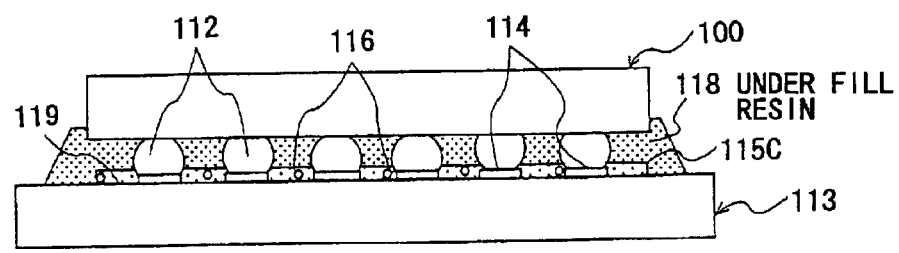
FIG. 8B

METHOD FOR MOUNTING ELECTRONIC PART AND PASTE MATERIAL

BACKGROUND OF THE INVENTION

1. Field of the Invention

The present invention generally relates to a method for mounting an electronic part and a paste material, and more particularly to the method for mounting an electronic part in which a projection electrode of an electronic part is welded by fusion to a connection terminal of a mounting substrate in a flip-chip bonding scheme, and the paste material used in the method.

Recently, as represented by a cellular phone or the like, an electronic part such as a semiconductor device has been improved in terms of reduced size, higher density, and speed. In response to these improvements, a flip-chip bonding scheme has been more frequently used in that a projection electrode such as a solder bump is used as an external connection terminal of the electronic part and the projection electrode is joined to a mounting substrate so as to electrically connect the mounting substrate to the electronic part.

According to this flip-chip bonding scheme, compared with a bonding scheme using lead, since the surface area needed to mount the electronic part can be smaller, it is possible to realize a minimization of the size and a higher density placement. Moreover, it is possible to improve a rate in which a wiring length between the electronic part and the mounting substrate can be shortened.

2. Description of the Related Art

As a flip-chip bonding method for bonding an electronic part having a projection electrode such as a solder bump, a conventional bonding method has been used in that the electronic part is attached to a bonding tool, adjusted at a bonding position on a mounting substrate, and pressed and heated so that a solder bump is contacted and melted so as to be joined. However, since the conventional bonding method individually processes the electric part, the conventional bonding method is less effectively than a surface bonding reflow soldering method.

In contrast to the conventional bonding method, in order to improve operational efficiency, another conventional method similar to a general surface bonding reflow soldering method is also applied in that a solder paste is printed on a connection terminal of the mounting substrate, the solder bump of the electronic part is aligned to be located where the solder paste is printed, and the solder bump is melted by a reflow process to be joined. This method is hereinafter called a first conventional technology. FIGS. 1A, 1B, 1C, and 1D are diagrams showing a mounting method according to the first conventional technology.

In FIG. 1A, a state where a solder paste 5 is printed to a mounting substrate 3 is shown. The solder paste 5 having a volume ratio of a solder grain of about 50% is generally used. This solder paste 5 is arranged on a connection terminal 4 of the mounting substrate 3 using a screen printing method.

Subsequently, a solder bump 2 of a semiconductor device 1 is aligned to the connection terminal 4 of the mounting substrate 3, and as shown in FIG. 1B, the semiconductor device 1 is mounted on the mounting substrate 3. Thereby, the semiconductor device 1 is temporarily fixed on the mounting substrate 3 by the solder paste 5.

Subsequently, the mounting substrate 3 where the semiconductor device 1 is temporarily fixed is passed through a reflow furnace, and the solder bump 2 is melted to join to the connection terminal 4. In FIG. 1C, the solder bump 2 is joined to the connection terminal 4. When the solder bump 2 is completely joined to the connection terminal 4 by the reflow process, unremoved flux is washed off if needed. As shown in FIG. 1D, the semiconductor device 1 is completely mounted to the mounting substrate 3.

On the other hand, by utilizing a fact that the bump itself is solder, another method is also applied in that only flux is coated on a mounting substrate or at an end of a solder bump, and the electronic part is mounted on a mounting substrate by the reflow process. This method is hereinafter called a second conventional technology. Another mounting method will be described according to this second conventional technology with reference to FIGS. 2A, 2B, 2C and 2D. Also in FIGS. 2A, 2B, 2C, and 2D, an example using the semiconductor device 1 as the electronic part is shown.

FIG. 2A is a diagram showing a state where flux 18 is printed to a mounting substrate 13. Different from the solder paste 15 in FIG. 1A, the flux 18 does not contain the solder grain. The flux 18 is arranged to completely cover the upper surface of the mounting substrate 13.

Subsequently, the solder bumps 12 of the semiconductor device 11 are adjusted to be aligned to the connection terminals 14 of the mounting substrate 13, respectively. As shown in FIG. 2B, the semiconductor device 11 is mounted on the mounting substrate 13. Thereby, the semiconductor device 11 is temporarily joined to the mounting substrate 13 by the flux 18.

The mounting substrate 13 where the semiconductor device 11 is mounted on the mounting substrate 13 is passed through the reflow furnace. The solder bumps 12 are melted to join to the connection terminals 14. FIG. 2C is a diagram showing a state where the solder bumps 12 are joined to the connection terminals 14. When the solder bumps 12 are completely joined to the connection terminals 14 by the reflow process, residue flux is washed off if needed. Thereby, as shown in FIG. 2D, the semiconductor device 11 is completely mounted to the mounting substrate 13.

However, in the first conventional technology, a technology is required to minutely print each solder paste 5 on each connection terminal 4 of the mounting substrate 3. In a case in which the printing process is not properly performed, a bridge part 6 between the connection terminals 4 is produced (see FIG. 1C and FIG. 1D). Also, a poor joint between the solder bump 2 and the connection terminal 4 is caused.

In the solder paste 5 whose volume ratio of the solder grains is about 50%, in a case in which a bump pitch of the semiconductor device 1 is less than 150 micrometers, it is difficult to properly print each solder paste 5 to each minutely formed connection terminal 4 corresponding to this bump pitch. Furthermore, the semiconductor device 1 being mounted must be stably attached at a predetermined mounting position on the mounting substrate 3 until the reflow process is completed. However, it is difficult for a minute amount of the solder paste 5 printed on connection terminals 4 to sufficiently maintain the attachment.

On the other hand, in the second conventional technology described above, since an allowance for a flatness of the solder bump 2 in relation to the mounting substrate 3 is small, the connection terminals 4 of the mounting substrate 3 may not be joined with the solder bumps 2. That is, a variation in a diameter inevitably exists in the solder bumps 2 (shown by an arrow ΔH in FIG. 2A). For this reason, such as a solder bump 12B shown in FIG. 2A, if a diameter of the solder bump 12 is smaller than that of a normal solder bump 12A, a space occurs between the solder bump 2B and the connection terminal 4.

In the mounting method according to the first conventional technology shown in FIG. 1A through FIG. 1D, since the solder paste 5 contains solder grains as about 50% of the volume ratio of the solder paste 5, even if the space occurs between the solder bump 2 and the connection terminal 4 when the solder grain fuses in a heating process, fused solder grain fills the space. Accordingly, the space as a problem does not occur in the mounting method according to the first conventional technology.

However, in the mounting method according to the second conventional technology shown in FIG. 2A through FIG. 2D, since the solder grain does not exist in the flux 18, when a space is formed between the solder bump 12B and the connection terminal 14 because of the variation of a diameter of the solder bump 12B, a state where an interval is defined between the solder bump 12B and the connection terminal 14 is maintained even in the reflow process. As a result, the interval causes a poor connection between the solder bump 12B and the connection terminal 14.

In order to solve problems described above, Japanese Laid-Open Patent Application No. 4-262890 discloses that a semiconductor device (solder bumps are not provided) and a mounting substrate are joined by a thermosetting adhesive bond containing a solder grain and flux. Moreover, Japanese Laid-Open Patent Application No. 11-186334 discloses that an anisotropic conductive material, in which the solder grain having the flux is contained in a thermosetting resin sheet or paste, is used and a mounting substrate is joined to a semiconductor device by this anisotropic conductive material.

However, in these disclosed mounting methods, it is required to select a thermosetting adhesive bond, a thermosetting resin sheet, or an anisotropic conductive material (hereafter generally called thermosetting resin) in order to tolerate the heating process in a soldering process. Furthermore, since this thermosetting resin has a function as a so-called under fill resin, this thermosetting resin is influenced by a combination of a size of a semiconductor device, a space of the semiconductor device and the mounting substrate, an electrode material, a mounting substrate material, and the like. Accordingly, in order to secure mounting reliability, it is required to adjust material characteristics such as an elasticity modulus, a thermal expansion coefficient, and such as an adhesive strength. However, to select the thermosetting resin, it is required to consider both the heat resistance in the heating process and the characteristic as the under fill resin. Therefore, it is complicated to select a suitable thermosetting resin.

SUMMARY OF THE INVENTION

It is a general object of the present invention to provide a method for mounting an electronic part and a paste material in which the above-mentioned problems are eliminated.

A more specific object of the present invention is to provide a method for mounting an electronic part and a paste material, in which a mounting reliability between projection electrodes and connection terminals can be improved when the electronic part is mounted on the mounting substrate.

The above objects of the present invention are achieved by a method for mounting an electronic part on a mounting substrate in that projection electrodes provided on the electronic part are welded by fusion to join connection terminals provided on the mounting substrate, the mounting method including the steps of: arranging a flux paste on the mounting substrate, the flux paste including a base flux and metal grains having diameters smaller than diameters of the projection electrodes and having a thickness so as to form a space between the flux paste and the electronic part when the electronic part is mounted on the mounting substrate; and sealing a resin in the space formed between the electronic part and the mounting substrate after the projection electrodes are joined to the connection terminals.

According to the present invention, even if a space occurs between the top of the projection electrode and the connection terminal in joined positions by variation in the diameter (height) due to the projection electrode, since the flux paste including the metal grains and the base flux is arranged on the mounting substrate, the metal grains existing in the space assist in joining the projection electrode to the connection terminal. That is, even if the space exists between the projection electrode and the connection terminal, the metal grains connect the space electrically. Therefore, it is possible to prevent a poor joining from occurring between the projection electrode and the connection terminal. In this case, since the diameters of the metal grains are defined as smaller than the diameters of the projection electrodes, a distance from the electronic device to the mounting substrate cannot be more than the diameters of the projection electrodes due to the metal grains.

Moreover, since the space formed between the electronic part and the mounting substrate is filled up with the resin, it is possible to improve a mounting strength between the electronic part and the mounting substrate. It is possible to easily select the resin arranged at this time without considering the quality of the material of the flux paste.

In the method described above, the diameters of the metal grains may be defined to be more than a tolerance of diameters of the projection electrodes and less than one third the diameters of the projection electrodes, and the flux paste may include the metal grains more than one percent and less than twenty percent by volume ratio.

According to the present invention, since the diameters of the metal grains are defined smaller than the tolerance of the diameters of the projection electrodes, even if the space occurs between the projection electrodes and the connection terminals due to the variation in the diameters of projection electrodes, the connection terminals can be electrically connected to the projection electrodes securely.

That is, when the electronic part is mounted on the mounting substrate, the space, which occurs between the projection electrodes and the connection terminals due to the variation in the diameters of the projection electrodes, becomes at maximum in the tolerance of the diameters of the projection electrodes. Thus, by defining the diameters of the metal grains as more than the tolerance of the diameters of the projection electrodes, namely, by defining the diameters of the metal grains more than a maximum space that may occur, the projection electrodes can be securely electrically connected to the connection terminals.

Moreover, by defining the diameters of the metal grains as less than one third the diameters of the projection electrodes, when fusing the projection electrodes and joining the projection electrodes to the connection terminals, it is possible to prevent adjacent projection electrodes from short-circuiting by connecting to the metal grains.

Furthermore, the flux paste includes the metal grains more than one percent and less than twenty percent by the volume ratio. Compared with a conventional solder paste which is generally used and includes the solder grains about fifty percent by the volume ratio, it is possible to suppress the occurrences of bridge defects without severely controlling an arrangement amount. In addition, it is possible to securely maintain the electronic part mounted on the mounting substrate until the projection electrodes are joined by fusion to the connection terminals.

In the method described above, the flux paste may be arranged on an area having the connection terminals of the mounting substrate by a thickness being more than the diameters of the metal grains and less than half the diameters of the projection electrodes.

According to the present invention, the flux paste is arranged on the mounting substrate by a thickness that is more than the diameters of the metal grains and less than half the thickness of the projection electrodes. Thus, when the joining process is completed, it is possible to prevent the space between the electronic part and the mounting substrate from being filled up with the unremoved flux. Therefore, it is possible to easily conduct the sealing process by the resin after the joining process.

In the method described above, a base flux of the flux paste may include a resin used to seal the space as a main constituent.

According to the present invention, the base flux that remains after the joining process has the same constituents as the resin arranged between the electronic part and the mounting substrate after that, a connectivity to the resin for sealing is favorable. Therefore, it is not required to wash the base flux off before arranging the resin.

Alternatively, in the method described above, the base flux of the flux paste may include a constituent in which filler is eliminated from a resin used to seal the space, as a main constituent.

According to the present invention, when the projection electrodes are joined to the connection terminals, since the filler of the resin described above does not exist between the projection electrodes and the connection terminals, it is possible to improve the connectivity.

Moreover, in the method described above, the projection electrodes may have a spherical shape, and the metal grains may have a shape having a smooth surface so as to be movable when the projection electrodes are pressed to the connection terminals.

According to the present invention, the electronic part is mounted on the mounting substrate, the metal grains move smoothly between the projection electrodes and the connection terminals while the projection electrodes approach the connection terminals. Even if the space exists between the projection electrodes and the connection terminals, the metal grains electrically connect the projection electrodes and the connection terminals securely in the space. Therefore, it is possible to improve the mounting reliability of the projection electrodes and the connection terminals.

The above objects of the present invention are achieved by a method for mounting an electronic part on a mounting substrate in that projection electrodes provided on the electronic part are welded by fusion to join connection terminals provided on the mounting substrate, the mounting method including the steps of: arranging a flux paste on the projection electrodes, the flux paste including metal grains having diameters smaller than diameters of the projection electrodes and having a thickness so as to form a space between the electronic part and the flux paste when the electronic part is mounted on the mounting substrate; joining the projection electrodes to the connection terminals by mounting the electronic part on the mounting substrate and conducting a heating process; and sealing a resin in the space formed between the electronic part and the mounting substrate after the projection electrodes are joined to the connection terminals.

According to the present invention, since the metal grains electrically connect the projection electrodes to the connection terminals in the space even if the space exists between the projection electrodes and the connection terminals, it is possible to prevent occurrences of joint defects between the projection electrodes and the connection terminal. In addition, since the resin for sealing fills up between the electronic part and the mounting substrate, it is possible to improve the mounting strength between the electronic part and the mounting substrate.

In the present invention, the diameters of the metal grains may be defined to be more than a tolerance of the diameters of the projection electrodes and less than one third the diameters of the projection electrodes, and the flux paste includes the metal grains more than one percent and less than twenty percent by volume ratio.

According to the present invention, even if the space occurs between the projection electrodes and the connection terminals due to the variation in the diameters of the projection electrodes, it is possible to electrically connect the projection electrodes to the connection terminals. In addition, the diameters of the metal grains are defined less than one third the diameters of the projection electrodes. Therefore, it is possible to prevent adjacent projection electrodes from short-circuiting by the metal grains.

Furthermore, the flux paste includes the metal grains more than one percent and less than twenty percent by the volume ratio. Thus, it is possible to suppress the occurrences of a bridge defects without severely controlling the arrangement amount. Also, it is possible to securely maintain the electronic part mounted on the mounting substrate until the projection electrodes are joined by fusion to the connection terminals.

The above objects of the present invention are achieved by a paste material used to weld by fusion projection electrodes provided on an electronic part to connection terminals provided on a mounting substrate, the paste material including: metal grains; and a base flux, wherein diameters of the metal grains are defined to be more than a tolerance of diameters of the projection electrodes and less than one third the diameter of the projection electrodes, and the metal grains are included more than one percent and less than twenty percent by volume ratio.

According to the present invention, even if the space occurs between the projection electrodes and the connection terminals due to the variation in the diameters of the projection electrodes, the connection terminals are electrically connected to the projection electrodes securely. In addition, the diameters of the metal grains are defined less than one third the diameters of the projection electrodes. Thus, when the projection electrodes are joined by fusion to the connection terminals, it is possible to prevent adjacent projection electrodes from short-circuiting by the metal grains.

Moreover, the flux paste includes the metal grains more than one percent and less than twenty percent by the volume ratio. Thus, it is possible to suppress the occurrences of the bridge defects without severely controlling the arrangement amount. Also, it is possible to securely maintain the electronic part mounted on the mounting substrate until the projection electrodes are joined by fusion to the connection terminals.

BRIEF DESCRIPTION OF THE DRAWINGS

Other objects, features, and advantages of the present invention will become more apparent from the following detailed description when read in conjunction with the accompanying drawings, in which:

FIGS. 3A, 3B, 3C, 3D and 3E are diagrams showing a mounting method for mounting a semiconductor device, according to a first embodiment of the present invention;

FIG. 7 is an enlarged diagram showing the semiconductor device on which the flux paste is arranged; and FIG. 8A and FIG. 8B are diagrams showing another method for mounting the semiconductor device, according to a third embodiment.

DESCRIPTION OF THE PREFERRED EMBODIMENTS

Figure 1A:
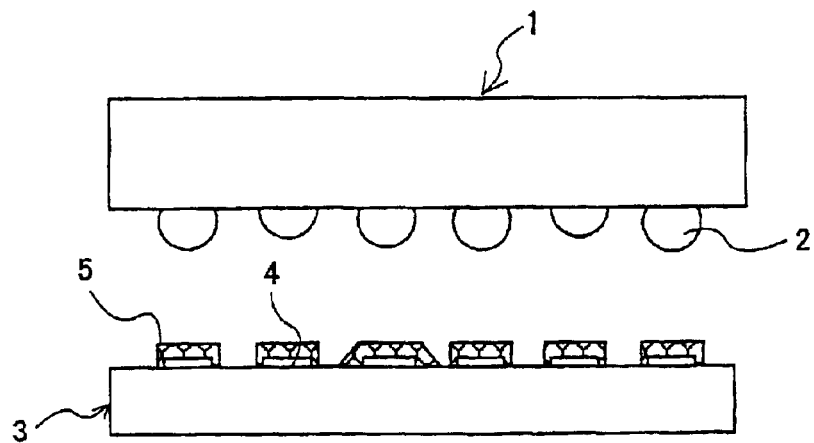
FIGS. 1A, 1B, 1C, and 1D are diagrams showing a mounting method according to a first conventional technology.
Figure 1B:
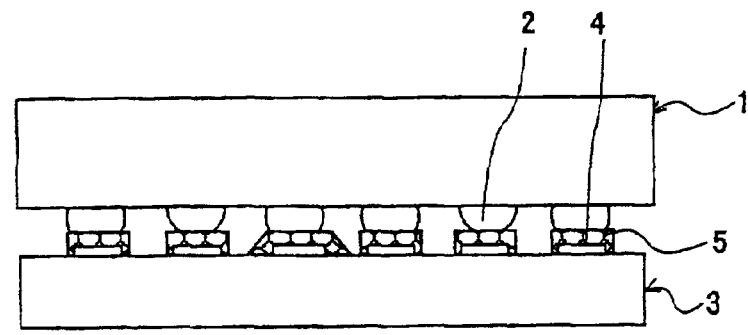
Figure 1C:
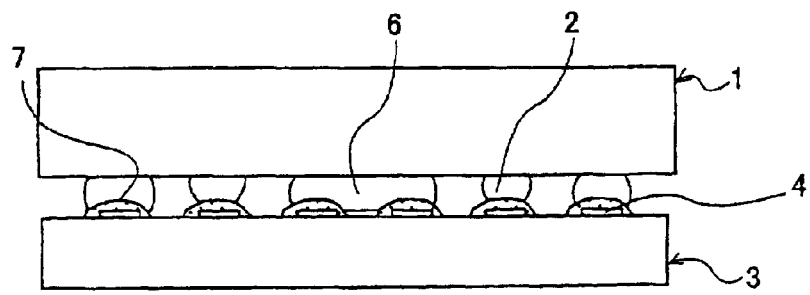
Figure 1D:
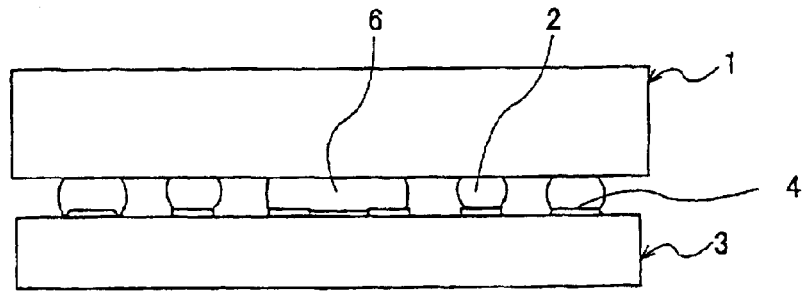
Figure 2A:
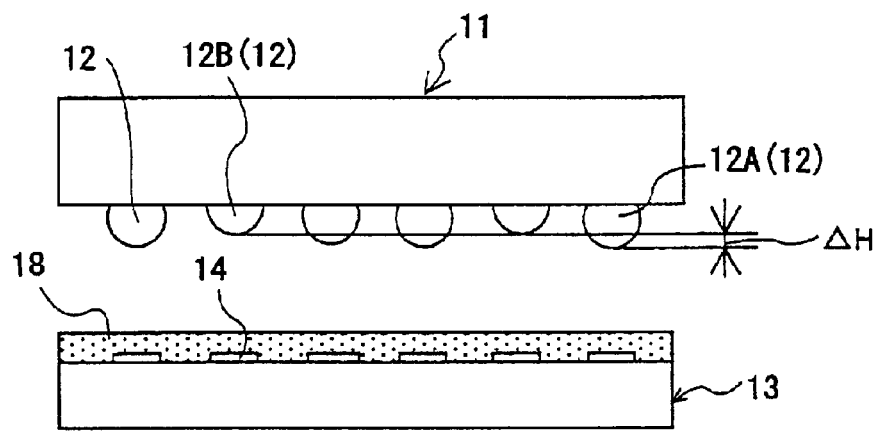
FIGS. 2A, 2B, 2C, and 2D are diagrams showing a mounting method according to a second conventional technology.
Figure 2B:
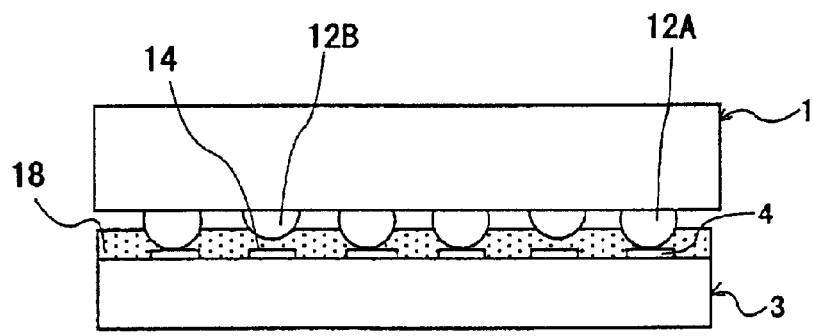
Figure 2C:
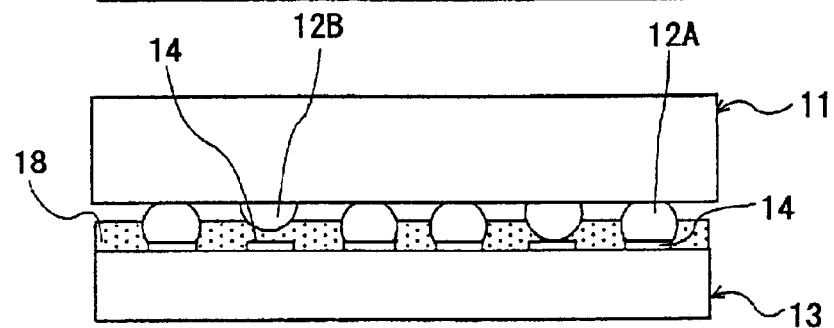
Figure 2D:
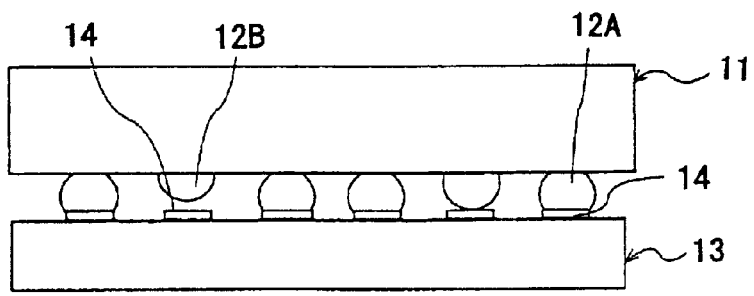

Embodiments according to the present invention will be described with reference to figures.

A mounting method for mounting an electronic part and a paste material will be described according to a first embodiment of the present invention with reference to FIG. 3A through FIG. 3E, FIG. 4, and FIG. 5. In the first embodiment, a semiconductor device 100 is illustrated as an electric part.

In the mounting method according to the first embodiment of the present invention, the semiconductor device 100 is mounted to a mounting substrate 113 by flip chip bonding. In order to mount the semiconductor device 100 to the mounting substrate 113 by flip chip bonding, as shown in FIG. 3A, a flux paste 115A is arranged on the mounting substrate 113 with a thickness H2. For example, the semiconductor device 100 is a bear chip with a bump or a CSP (chip size package) type semiconductor device and a plurality of projection electrodes are arranged on the semiconductor device 100. In the first embodiment of the present invention, a solder bump 112 is used as the projection electrode. However, the projection electrode arranged on the semiconductor device 100 is not limited to the semiconductor device 100, but the present invention can be applied to another bump such as a stud bump, a plating bump, or the like.

Although each solder bump 112 has a diameter H1, a predetermined tolerance ΔH is allowed for the diameter H1 because of a manufacturing error. It should be noted that the predetermined tolerance A H is a diameter difference between one solder bump 112 (solder bump 112A illustrated in FIG. 3A) having a maximum diameter allowed for the solder bump 112 and another solder bump 112 (solder bump 112B illustrated in FIG. 3A) having a minimum diameter allowed for the solder bump 112.

On the other hand, for example, the mounting substrate 113 is a wiring substrate made from a glass epoxy, and connection terminals 114 and wiring (not shown) are arranged on a front surface of the mounting substrate 113. The flux paste 115A is arranged all over an upper surface of the mounting substrate 113. A method for arranging the flux paste 115A on the mounting substrate 113 is not limited, but for example, a stencil printing, a screen printing, or the like can be used to form the flux paste 115A on the mounting substrate 113.

In this case in which the stencil printing is applied, it is preferable to set a viscosity of the flux paste 115A to approximate 30 Pascal second. Moreover, in a method for arranging the flux paste 115A, it is necessary to manage a thickness of the flux paste 115A.

A detailed configuration of the flux paste 115A will be described. The flux paste 115A is configured in that metal grains 116 are mixed in a base flux 117. Specifically, the flux paste 115A is produced by mixing so that the base flux 117 includes the metal grains 116 less than 20% and more than 1% by volume ratio.

The metal grains 116 are formed by the metal having conductivity, and specifically, a solder, gold, or silver can be used. The diameters of the metal grains 116 are defined so as to be more than a tolerance ΔH of a diameter of the solder bump 112 mentioned above, and less than approximately one third the diameter H1 of the solder bump 112.

Moreover, for the base flux 117, it is possible to use resin flux that is normal soldering flux. Considering suitability with the under fill resin 118 sealing between the semiconductor device 100 and the mounting boards 113, the resin material used for the under fill resin 118 can be also used as the base flux 117, as described later.

In this case, the resin material which contains an epoxy resin and its hardener is generally applied as an under fill resin 118. An acid anhydride hardener or an amine hardener also includes a function as an activator of flux. For this reason, in a case in which the resin material used as the under fill resin 118 is used as the base flux 117, even if the activator is not added, the resin material itself to be used as an under fill resin 118 can be used as the base flux 117.

Figure 4:
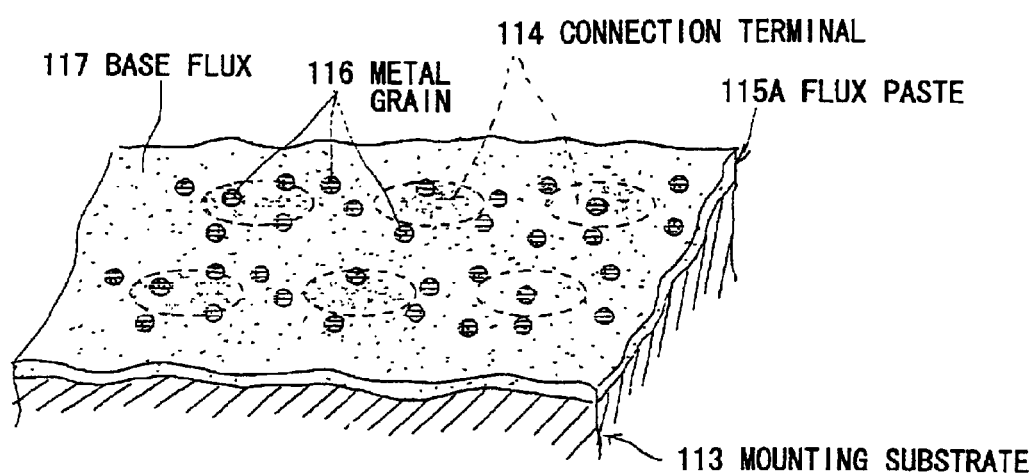
FIG. 4 is an enlarged diagram showing a state in which a flux paste is arranged on a mounting substrate.
Figure 5:
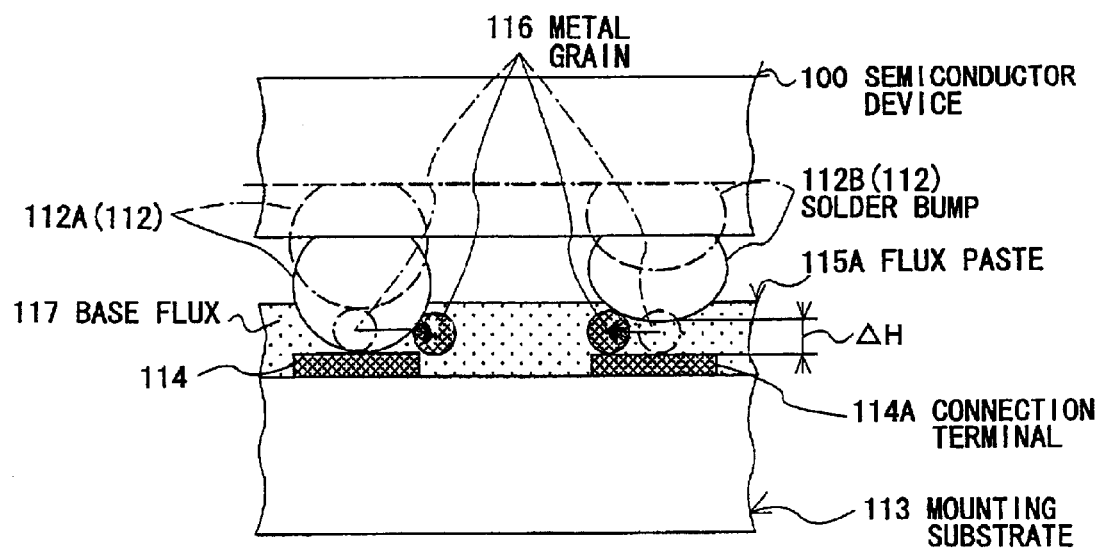
FIG. 5 is an enlarged diagram showing a state in which the semiconductor device is pressed to the mounting substrate.

FIG. 4 is an enlarged diagram showing a state in which the flux paste 115A is arranged on the mounting substrate 113. As shown in FIG. 4, in the state in which the flux paste 115A is arranged on the mounting substrate 113, an approximately same number of the metal grains 116 is uniformly located with per unit area on a formation area on the mounting substrate 113 where each of the connection terminals 114 is formed. Moreover, a thickness of the flux paste 115A on the mounting substrate 113 is defined to be more than half the diameter of the metal grains 116 and less than a diameter of the solder bump 112.

Referring to FIG. 3A, the mounting method will continue to be explained. When a process for arranging the flux paste 115A on the mounting substrate 113 as described above is completed, as shown in FIG. 3B, locations of each the connection terminals 114 on the mounting substrate 113 and each of the solder bumps 112 on the semiconductor device 100 are adjusted to face each other and the semiconductor device 100 is mounted on the mounting substrate 113. Thereby, the semiconductor device 100 adheres and is temporarily fixed to the mounting substrate 113 by adhesive strength of the flux paste 115A (specifically, the base flux 117).

When the semiconductor device 100 is mounted on the mounting substrate 113, it is preferable to apply a force upon the mounting substrate 113 from above the semiconductor device 100, so that the solder bumps 112 of the semiconductor device 100 contact with the connection terminals 114 of the mounting substrate 113. Thus, the metal grains 116 that exist under the solder bumps 112 are forced outward by the force. In detail, the metal grains 116 (shown by lattice lines), which exist under the solder bumps 112, are forced outward in directions shown by arrowheads in FIG. 5 by pushing the semiconductor device 100 towards the mounting substrate 113.

In the first embodiment in this case, the solder bumps 112 have a ball shape and the metal grains 116 also have a shape having a smooth surface (specifically, spherical shape) so as to easily move when the solder bumps 112 are pressed by the connection terminals 114. Thus, the metal grains 116 are easily moved toward horizontal directions (that is, the directions shown by the arrowheads) as the solder bumps 112 approach the connection terminals 114.

In a case in which variation exists in diameters (heights) of the solder bumps 112, an extent to which the metal grains 116 are forced outward varies depending upon the diameter size of each of the solder bumps 112. That is, in a case in which one of the solder bumps 112 (especially a solder bump 112A) has a larger diameter, the solder bump 112A directly contacts the connection terminal 114. Accordingly, the metal grain 116 is located to a side of the junction location of the solder bump 112A and the connection terminal 114.

On the other hand, when the solder bump 112A having the larger diameter contacts the connection terminal 114, one of the solder bumps 112 (especially a solder bump 112B) having a smaller diameter is positioned in a state of departing from the connection terminal 114. And, the metal grain 116 is located so as to be sandwiched between solder bump 112B and a connection terminal 114. As described above, since the metal grain 116 is formed with the metal having conductivity, even if the solder bump 112B is departed from the connection terminal 114, the solder bump 112B is electrically joined to the connection terminal 114.

Thereby, even if a space exists between the solder bump 112B and the connection terminal 114, the solder bump 112B and the connection terminal 114 are securely joined electrically. Therefore, it is possible to improve a mounting reliability of the semiconductor device 100 and the mounting substrate 113.

As described above, the diameters of the metal grains 116 are set larger than the tolerance ΔH of the diameters of the solder bumps 112. The tolerance ΔH is a diameter difference between a maximum diameter and a minimum diameter that are permitted for the solder bumps 112. Namely, in a case in which the semiconductor device 100 is mounted on the mounting substrate 113, the tolerance ΔH can be a maximum of the space formed between the solder bumps 112 and the connection terminals 114.

The diameters of the metal grains 116 are set larger than tolerance ΔH of the diameter of the solder bumps 112. That is, the diameters of the metal grains 116 are set larger than a maximum of the space (space between the solder bumps 112 and the connection terminals 114) which may occur. Therefore, it is possible to electrically join each of the solder bumps 112 with each of the terminal connections 114 securely.

Moreover, in the first embodiment, the diameters of the metal grains 116 are set so as to be less than approximately one third the diameters of the solder bumps 112 (the diameter designed for the solder bumps 112, or an average diameter of the solder bumps 112 arranged on the semiconductor device 100). The maximum diameter of the metal grains 116 is specified because if the maximum diameter of the metal grains 116 is larger than a specified maximum diameter, the metal grains 116 can bridge between adjacent connection locations where the solder bumps 112 and the connection terminals 114 are joined, and a short-circuit may be caused. Therefore, by specifying the diameters of the metal grains 116 to be less than approximately one third the diameters of the solder bumps 112, it is possible to prevent the short-circuit caused by connecting the adjacent connection locations by the metal grains 116.

Moreover, the short-circuit caused between the adjacent connection locations is influenced by a mixture rate of the metal grains 116 to the base flux 117 of which the flux paste 115A is made up. That is, the short-circuit described above becomes more easily caused by increasing the mixture rate of the metal grains 116 to the base flux 117.

In the first embodiment, the flux paste 115A includes the metal grains 116 more than 1% and less than 20% by the volume ratio. By this configuration, compared with a conventional solder paste which is generally used and includes solder grains approximately 50% by the volume ratio, it is not required to set a control of an arrangement amount with respect to the flux paste 115A and it is possible to prevent from causing the short-circuit.

Furthermore, if the content of the metal grains 116 is increased, the content ratio of base flux 117 will decrease relatively. Thus, it can be considered that pre-stop force decreases when the semiconductor device 100 is mounted on the mounting substrate 113.

However, in the flux paste 115A in the configuration of including more than 1% and less than 20% of the metal grains 116, required pre-stop force can be maintained. And, until the metal grains 116 are welded by fusion to the connection terminals 114, it is possible to securely maintain the semiconductor device 100 on the mounting substrate 113. Accordingly, after the semiconductor device 100 is mounted on the mounting substrate 113, it is possible to prevent the semiconductor device 100 from separating from the mounting substrate 113 until the metal grains 116 are welded by fusion to the connection terminals 114.

As described above, when the semiconductor device 100 is mounted on the mounting substrate 113, the mounting substrate 113 mounting the semiconductor device 100 is passed through the reflow process and the solder bumps 112 are heated and welded by fusion to the connection terminals 114. In this process, by a flux agency of the flux paste 115A, the solder bumps 112 and the surface oxide film of the connection terminals 114 are removed. The solder bumps 112 become liquid and spread over the connection terminals 114.

Moreover, when the semiconductor device 100 is mounted on the mounting substrate 113, the metal grains 116 are forced outward by the side part of the solder bumps 112A having a normal diameter (height) or a larger diameter and are drawn toward the solder bumps 112A by a surface tension of the solder bumps 112A that are melted. At this time, an interval between the semiconductor device 100 and the mounting substrate 113 becomes less while the solder bumps 112 spread to widely flow over the connection terminals 114.

On the other hand, in the connection location of the solder bump 112B having a smaller diameter (height) and the connection terminal 114, since the solder bump 112B is not directly joined to the connection terminal 114, the solder bump 112B does not directly spread to widely flow over the connection terminal 114. However, the connection terminal 114 becomes liquid by the metal grains 116 existing in the interval. In addition, when the solder bump 112A having the normal diameter as described above is spread to flow over the connection terminal 114, the semiconductor device 100 sinks. As a result, the solder bump 112B having the smaller diameter also becomes liquid and spreads over the whole connection terminal 114.

Thereby, the solder bumps 112A and 112B are securely joined to the connection terminals 114 irrespective of the size of their diameters. FIG. 3C is a diagram showing a state in which each of the solder bumps 112 (including the solder bumps 112A and 112B) are joined to the connection terminals 114.

In this case, the metal grains 116 where the flux paste 115A is contained can be the same material of the solder bumps 112, and the metal grains 116 can be melted simultaneously when the solder bumps 112 are melted. Alternatively, by using a material having a melting point lower than the solder bumps 112, the metal grains 116 can be melted earlier than the solder bumps 112.

When the solder bumps 112 are joined to the connection terminals 114, as shown in FIG. 3D, a washing process is conducted upon the base flux 117 remaining (unremoved flux) and the metal grains 116 remaining (unremoved metal grains) so as to not prevent a formation process of the under fill resin 118 carried out later and to not degrade reliability of the formed under fill resin 118. If the unremoved flux and unremoved metal grains do not degrade the formation process for the under fill resin 118 and the reliability of a mounting process conducted later, the washing process is not always required.

When the washing process described above is completed, a forming process is subsequently conducted to pour a resin into the space formed between the semiconductor device 100 and the mounting substrate 113 so as to form the under fill resin 118. In this case, since the unremoved flux and the unremoved metal grains do not exist between the semiconductor device 100 and the mounting substrate 113, it is possible to easily select the under fill resin 118.

By forming the under fill resin 118, a mechanical strength of the junction between the semiconductor device 100 and the mounting substrate 113 becomes a combined strength of the joint strength of the solder bumps 112 and the joint strength of the under fill resin 118.

Therefore, even if a stress occurs between the semiconductor device 100 and the mounting substrate 113 due to a difference between thermal expansion coefficients of the semiconductor device 100 and the mounting substrate 113, it is possible to prevent stress being concentrated and applied only to the solder bumps 112. Consequently, it is possible to prevent occurrences of removal of and damage to the solder bumps 112 and to improve mounting reliability.

FIG. 6A through FIG. 6E and FIG. 7 are diagrams showing another mounting method for mounting the semiconductor device 100 (electronic part) according to a second embodiment of the present invention. In FIG. 6A through FIG. 6E and FIG. 7, parts that are the same as the ones in FIG. 3A through FIG. 3E, FIG. 4, and FIG. 5 are indicated by the same reference numerals and the explanation thereof will be omitted.

In the first embodiment described above, the flux paste 115A is arranged on the mounting substrate 113. Alternatively, in the second embodiment, the flux paste 115B is arranged on the solder bumps 112.

Figure 6A:
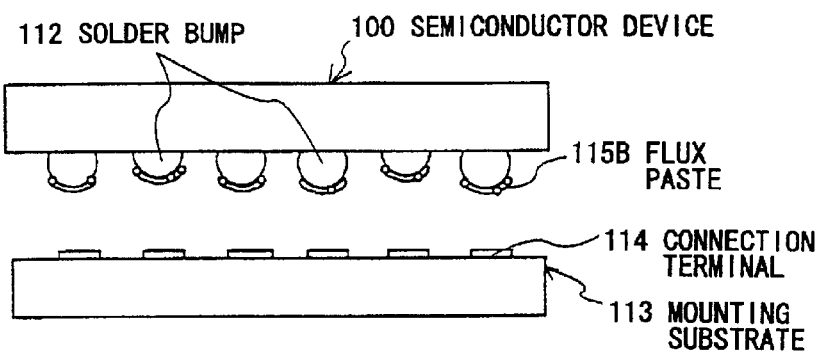
FIG. 6A through FIG. 6E are diagrams showing another mounting method for mounting the semiconductor device, according to a second embodiment of the present invention.

FIG. 6A is a diagram showing a state in which the semiconductor device 100 arranging a flux paste 115B is faced to the mounting substrate 113. FIG. 7 is an enlarged diagram showing the solder bumps 112 arranging the flux paste 115.

The flux paste 115B is made up of the metal grains 116 and the base flux 117 similar to the flux paste 115A used in the first embodiment. The configuration of the metal grains 116 and the mixture rate of the metal grains 116 to the base flux 117 are the same as those of the first embodiment.

Alternatively, a dispenser method for coating each of the solder bumps 112 by using a dispenser loading the flux paste 115B can be used.

Figure 6B:
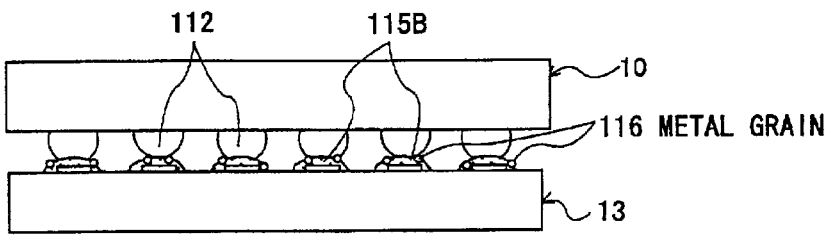
Figure 6C:
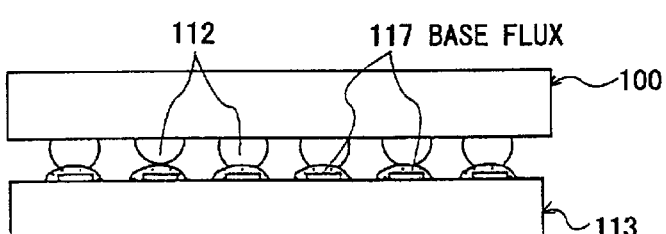
Figure 6D:
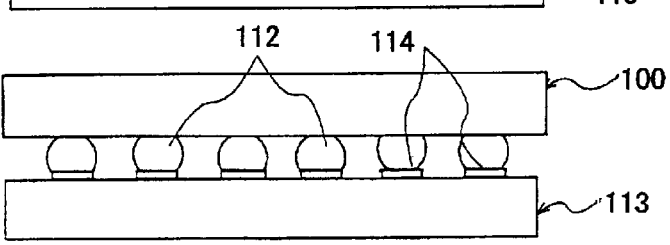
Figure 6E:
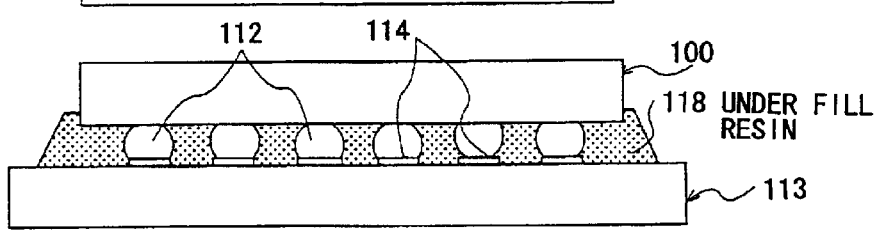

FIG. 6B through FIG. 6E are diagrams showing each process conducted after the flux paste 115B is arranged on the solder bumps 112. Each process in FIG. 6B through FIG. 6E is the same as that in FIG. 3B through FIG. 3E described in the first embodiment. That is, the semiconductor device 100 is mounted on the mounting substrate 113 (mounting process) as shown in FIG. 6B, and the heating process is conducted as shown in FIG. 6C, so that the solder bumps 112 are welded by fusion to the connection terminals 114. Subsequently, the washing process is conducted for unremoved flux and unremoved metal grains as shown in FIG. 6D, and the forming process is conducted to form the under fill resin 118 as shown in FIG. 6E.

In this case, in the mounting process of mounting the semiconductor device 100 on the mounting substrate 113 in FIG. 6B, even in a configuration of arranging the flux paste 115B on the solder bumps 112 according to the second embodiment, the metal grains 116, which exist under the solder bumps 112, are pushed out the side part of the solder bumps 112 while the semiconductor device 100 is pressed toward the mounting substrate 113 when the semiconductor device 100 is mounted on the mounting substrate 113. Therefore, even if there is variation in the diameter (height) of the solder bumps 112, the solder bumps 112 and the connection terminals 114 are electrically joined by the metal grains 116, regardless of the diameter size of the solder bumps 112.

Moreover, in the heating process shown in FIG. 6C, since the metal grains 116 are drawn toward the solder bumps 112 when the solder bumps 112 are melted, it is possible to securely join the solder bumps 112 to the connection terminals 114, regardless of the diameter size of the solder bumps 112. Furthermore, advantages realized in the first embodiment can be realized by the mounting method according to the second embodiment. That is, it is possible to prevent the short circuit caused by the adjacent connection locations being bridged by the metal grains 116, and it is possible to securely maintain the semiconductor device 100 on the mounting substrate 113 by the flux paste 115B after the semiconductor device 100 is mounted on the substrate 113.

A mounting method for mounting the semiconductor device 100 (electronic part) will be described according to a third embodiment with reference to FIG. 8A and FIG. 8B. In FIG. 8A and FIG. 8B, parts that are the same as the ones in FIG. 3A through FIG. 3E, FIG. 4, and FIG. 5 are indicated by the same reference numerals and the explanation thereof will be omitted.

The mounting method according to the third embodiment has a feature in a process corresponding to each process described in FIG. 3A through FIG. 3E in the first embodiment. In the second and the first embodiments, the unremoved flux is washed off so as to remove it after the solder bumps 112 are joined to the connection terminals 114.

In a case in which materials of the base flux 117 of the flux paste 115A and 115B are different from that of the under fill resin 118, if a connectivity of the base flux 117 and the resin material of the under fill resin 118 is poor, a filling nature of the under fill resin 118 is degraded.

On the other hand, in the third embodiment, base flux 119 including a flux paste 115C has a feature of that a resin used for the under fill resin 118 is a main constituent (in the third embodiment, the same material is applied). Thereby, the base flux 119, which remains after the solder bumps 112 are joined to the connection terminals 114, becomes approximately the same constituent as the under fill resin 118 which is formed later.

Therefore, the connectivity between the under fill resin 118 and the base flux 119 is improved, and it is possible to form the under fill resin 118 without removing the base flux 119. That is, as shown in FIG. 8A, it is possible to form the under fill resin 118 even in a state in which the base flux 119 remains. Accordingly, different from the first and the second embodiments, it is not required to wash the base flux 119 off before forming the under fill resin 118. Consequently, it is possible to simplify a mounting process conducted by the mounting method.

FIG. 8B is a diagram showing a state in which the under fill resin 118 is formed. In this state, since the under fill resin 118 is made up of the same material as that of the base flux 119, both the under fill resin 118 and the base flux 119 are unified. Thus, even if the base flux 119 is not completely removed, it is possible to securely form the under fill resin 118 between the semiconductor device 100 and the mounting substrate 113. In addition, it is possible to maintain mechanical strength between the semiconductor device 100 and the mounting substrate 113 at a predetermined strength.

In a case in which the base flux 119 is made up of the same main constituent of the under fill resin 118, thermosetting, which occurs when heat is applied to the solder bumps 112 and the connection terminals 114, can be a problem. The problem can be overcome by controlling an amount of a hardener for the resin in the base flux 119. For example, when the thermosetting proceeds relatively early, the amount of the hardener of the resin used for the base flux 119 is reduced, so that a joint hardening reaction can be controlled when the solder bumps 112 are joined to the connection terminals 114, and then the resin of the base flux 119 is completely hardened in the forming process for the under fill resin 118.

In a configuration of the third embodiment in which the base flux 119 remains on the mounting substrate 113, it is required to form a predetermined space between the base flux 119 remaining on the mounting substrate 113 and the semiconductor device 100. That is, it is required to form a space for the under fill resin 118 between the base flux 119 remaining on the mounting substrate 113 and the semiconductor device 100.

In the third embodiment, when the flux paste 115C is arranged on the mounting substrate 113, the flux paste 115C, which thickness is more than the diameter of the metal grains 116 and less than half the diameter of the solder bumps 112 is arranged on the mounting substrate 113. By arranging the flux paste 115C with this thickness, it is possible to prevent filling the space between the semiconductor device 100 and the mounting substrate 113 by the base flux 119 remaining on the mounting substrate 113 during the joining process for joining the solder bumps 112 and the connection terminals 114.

That is, it is possible to securely form the space in order to form the under fill resin 118 between the semiconductor device 100 and the base flux 119 remaining on the mounting substrate 113. Thereby, it is possible to easily and securely conduct the forming process for forming the under fill resin 118 after the joining process.

On the other hand, in the third embodiment, an example in that the under fill resin 118 has the same resin material of the base flux 119 is described. Alternatively, it is possible to use another base flux having a constituent, in which filler made up of a resin material being the same as the under fill resin 118 is eliminated, as a main constituent. In this configuration, since the filler does not exist between the solder bumps 112 and the connection terminals 114 when the solder bumps 112 are joined to the connection terminals 114, it is possible to improve the connectivity.

According to the present invention described above, the following advantages can be realized. In the first, the second, and the third embodiments, the solder bumps 112, the connection terminals 114, the metal grains 116, the under fill resin 118, the semiconductor device 100, and the mounting substrate 113 correspond to projection electrodes, connection terminals, metal grains, a resin, an electronic part, and a mounting substrate described in claims, respectively.

Even if the space exists between the projection electrodes and the connection terminals, the metal grains electrically connect the projection electrodes to the connection terminals in the space. Therefore, it is possible to prevent the occurrences of poor joints between the projection electrodes and the connection terminals. In addition, the resin arranged between the electronic part and the mounting substrate can be selected without being influenced by the quality of the material of the flux paste. Therefore, it is possible to easily select the resin.

Moreover, even if the space occurs between the projection electrode and the connection terminal due to the variation in the diameters of the projection electrodes, the connection terminal can be electrically connected to the projection electrodes securely. Also, the diameters of the metal grains are defined as more than one percent and less than one third the diameters of the projection electrodes. Thus, when the projection electrodes are joined by fusion to the connection terminals, it is possible to prevent adjacent projection electrodes from short-circuiting by connecting to the metal grains.

Furthermore, the flux paste includes the metal grains more than one percent and less than twenty percent by volume ratio. Thus, it is possible to suppress the occurrences of the bridge defects without severely controlling the arrangement amount. Also, it is possible to securely maintain the electronic part mounted on the mounting substrate until the projection electrodes are joined by fusion to the connection terminals.

Moreover, the space between the electronic part and the mounting substrate can be prevented from being filled with unremoved flux after the joining process is completed. Therefore, it is possible to easily conduct the sealing process by the resin.

Furthermore, the connectivity between the base flux remaining after the joining process and the resin for the sealing process is favorable. Thus, it is not required to wash the base flux off before arranging the resin. Therefore, it is possible to simplify the mounting process.

Moreover, the connectivity between the projection electrodes and the connection terminals can be improved in the joining process.

Furthermore, the projection electrodes are formed to be spherical shape and to have a smooth surface so as to be capable of being pushed outward when the projection electrodes are pressed to the connection terminals. Therefore, in a case in which the electronic part is mounted on the mounting substrate, since the metal grains move smoothly between the projection electrodes and the connection terminals while the projection electrodes approach the connection terminals, the mounting reliability between the projection electrodes and the connection terminals can be improved.

The present invention is not limited to the specifically disclosed embodiments, variations and modifications, and other variations and modifications may be made without departing from the scope of the present invention.

The present application is based on Japanese Priority Application No. 2001-134532 filed on May 1, 2001, the entire contents of which are hereby incorporated by reference.

What is claimed is:

1. A method for mounting an electronic part on a mounting substrate in that projection electrodes provided on said electronic part are welded by fusion to join connection terminals provided on said mounting substrate, said mounting method comprising the steps of:

arranging a flux paste on said mounting substrate, said flux paste including a base flux and metal grains having diameters smaller than diameters of said projection electrodes and having a thickness so as to form a space between said flux paste and said electronic part when said electronic part is mounted on said mounting substrate; and sealing a resin in the space formed between said electronic part and said mounting substrate after said projection electrodes are joined to said connection terminals.

2. The method as claimed in claim 1, wherein the diameters of said metal grains are defined to be more than a tolerance of diameters of said projection electrodes and less than one third the diameter of said projection electrodes, and said flux paste includes said metal grains more than one percent and less than twenty percent by volume ratio.

3. The method as claimed in claim 1, wherein said flux paste is arranged on an area having said connection terminals of said mounting substrate by a thickness being more than the diameters of said metal grains and less than half the diameters of said projection electrodes.

4. The method as claimed in claim 1, wherein a base flux of said flux paste includes a resin used to seal the space as a main constituent.

5. The method as claimed in claim 1, wherein a base flux of said flux paste includes a resin, which is used to seal the space and filler is eliminated from, as a main constituent.

6. The method as claimed in claim 1, wherein:

said projection electrodes have a spherical shape, and said metal grains have a shape having a smooth surface so as to be movable when said projection electrodes are pressed to said connection terminals.

7. A method for mounting an electronic part on a mounting substrate in that projection electrodes provided on said electronic part are welded by fusion to join connection terminals provided on said mounting substrate, said mounting method comprising the steps of:

arranging a flux paste on said projection electrodes, said flux paste including metal grains having diameters smaller than diameters of said projection electrodes and having a thickness so as to form a space between said electronic part and said flux paste when said electronic part is mounted on said mounting substrate;

joining said projection electrodes to said connection part by mounting said electronic part on said mounting substrate and conducting a heating process; and sealing a resin in said space formed between said electronic part and said mounting substrate after said projection electrodes are joined to said connection terminals.

8. The method as claimed in claim 7, wherein the diameters of said metal grains are defined to be more than a tolerance of the diameters of said projection electrodes and less than one third the diameter of said projection electrodes, and said flux paste includes said metal grains more than one percent and less than twenty percent by volume ratio.

9. The method as claimed in claim 7, wherein a base flux of said flux paste includes a resin used to seal the space as a main constituent.

10. The method as claimed in claim 7, wherein a base flux of said flux paste includes a resin, which is used to seal the space and filler is eliminated from, as a main constituent.

11. The method as claimed in claim 7, wherein:

said projection electrodes have a spherical shape, and said metal grains have a shape having a smooth surface so as to be capable of being pushed outward when said projection electrodes are pressed to said connection terminals.

* * * * *